(12) United States Patent
Li

(10) Patent No.: US 8,598,462 B2
(45) Date of Patent: Dec. 3, 2013

(54) CABLE MANAGEMENT APPARATUS

(75) Inventor: Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 104 days.

(21) Appl. No.: 13/338,516

(22) Filed: Dec. 28, 2011

(65) Prior Publication Data
US 2012/0228001 A1 Sep. 13, 2012

(30) Foreign Application Priority Data
Mar. 7, 2011 (CN) .......................... 2011 1 0053708

(51) Int. Cl.
*H01B 7/00* (2006.01)
(52) U.S. Cl.
USPC ........... 174/135; 174/480; 248/68.1; 439/451
(58) Field of Classification Search
USPC ................. 174/480, 135; 248/49, 68.1, 74.3; 439/451, 713
See application file for complete search history.

(56) References Cited

U.S. PATENT DOCUMENTS 7,304,861 B2 * 12/2007 Takahashi ...................... 361/760
8,093,496 B2 * 1/2012 Keith ............................. 174/50

* cited by examiner

*Primary Examiner* — Dhirubhai R Patel
(74) *Attorney, Agent, or Firm* — Altis & Wispro Law Group, Inc.

(57) ABSTRACT

A cable management apparatus includes a securing board and a cable management element. The securing board defines a first slot and a second slot. An extending direction of the first slot is substantially perpendicular to an extending direction of the second slot. The cable management includes a base panel, a connecting portion, a positioning tab corresponding to the first slot, a resilient tab corresponding to the second slot, and a securing panel extending from the base panel. The securing panel includes a panel body and a securing portion. The connecting portion includes a first connecting panel and a second connecting panel. A receiving space is defined between the panel body and the first connecting panel. The second connecting panel has a free end. The second connecting panel is capable of moving relative to the first connecting panel to enable the free end to be engaged in the securing portion.

14 Claims, 4 Drawing Sheets

CABLE MANAGEMENT APPARATUS

BACKGROUND

1. Technical Field

The present disclosure relates to cable management apparatuses, and more particularly to a cable management apparatus used in an electronic device.

2. Description of Related Art

Many electronic devices, such as computers, have multiple cables. The cables may include for example, power cables, data cables, communication lines, or keyboard lines. Therefore it is desirable to include some type of cable management apparatus, such as a binding accessory that allows the various cables to be collected together and attached in a position to improve the use of space and the ease of visual examination inside an electronic device. However, the binding accessories of related art are not suited for temporary use in securing cables, and cause inconvenience and an unnecessary waste of time when cables have to be replaced or re-routed.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
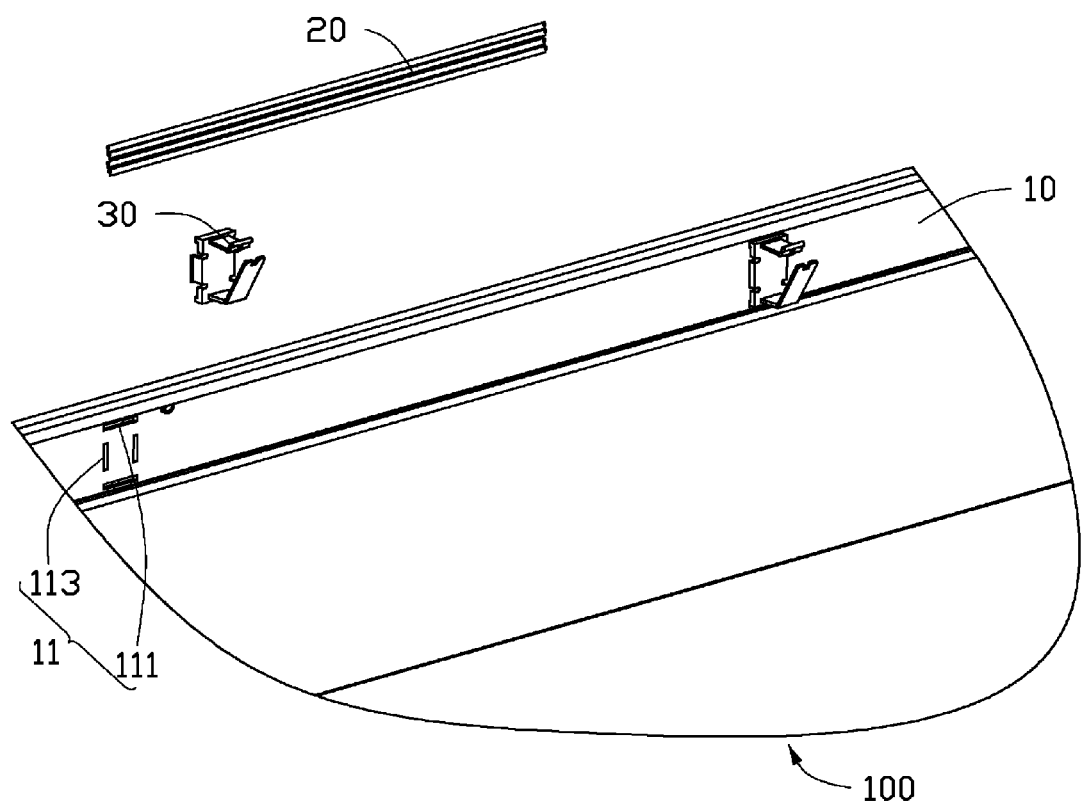
FIG. 1 is an isometric, exploded view of an embodiment of a cable management apparatus.
Figure 2:
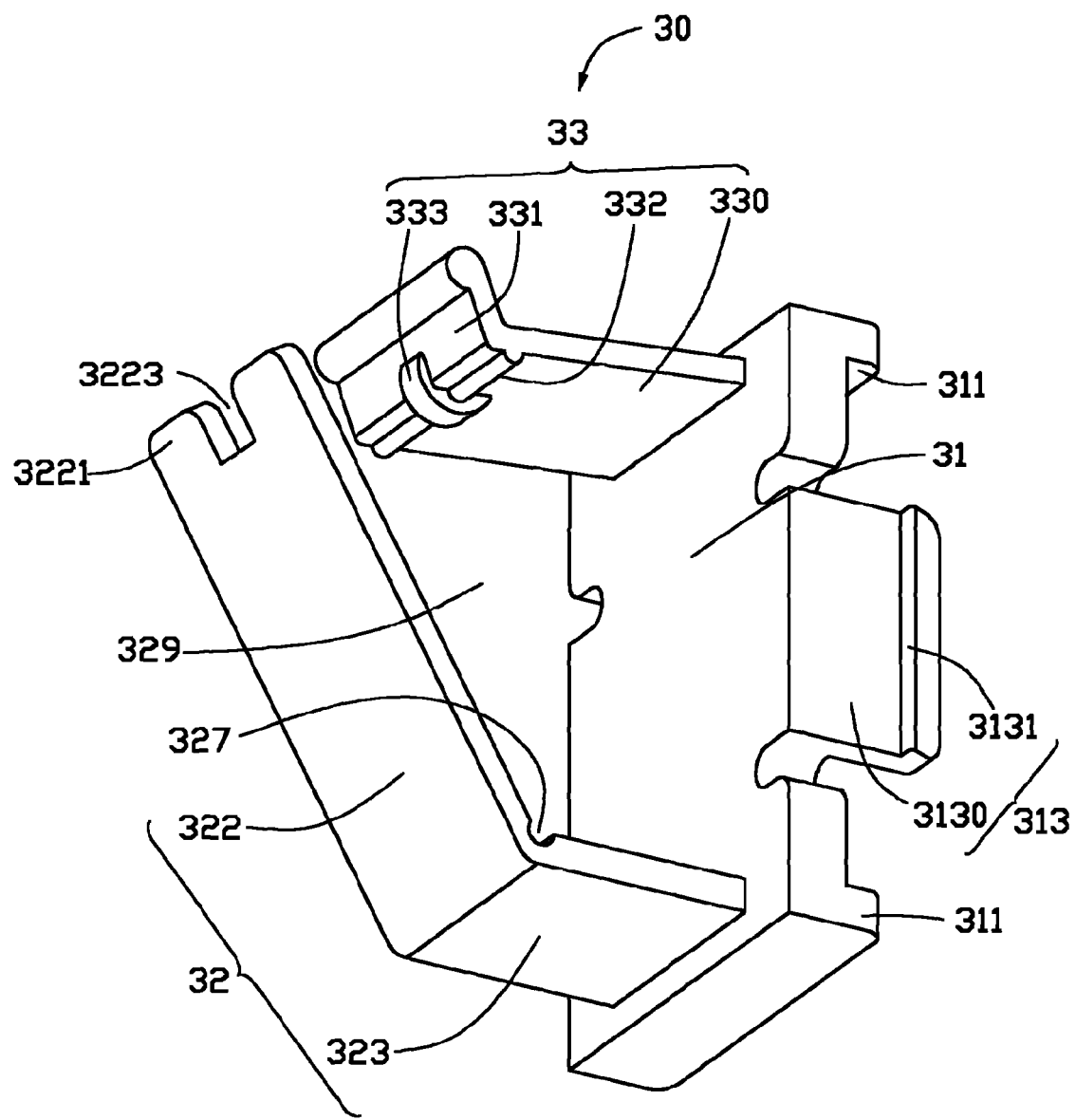
FIG. 2 is an isometric view of a cable management element of FIG. 1.

Referring to FIGS. 1 and 2, a cable management apparatus in accordance with an embodiment includes a securing board 10 and two or more cable management elements 30 mounted to the securing board 10. In one embodiment, the securing board 10 may be a side plate of an electronic device enclosure (enclosure 100), and the cable management elements 30 receive one or more cables 20.

The enclosure 100 includes a bottom plate (not labeled), and the securing board 10 is connected to the bottom plate. The securing board 10 has two positioning portions 11. Each positioning portion 11 includes a first slot 111 and a second slot 113. The extending direction of the first slot 111 is substantially perpendicular to the extending direction of the second slot 113.

Figure 3:
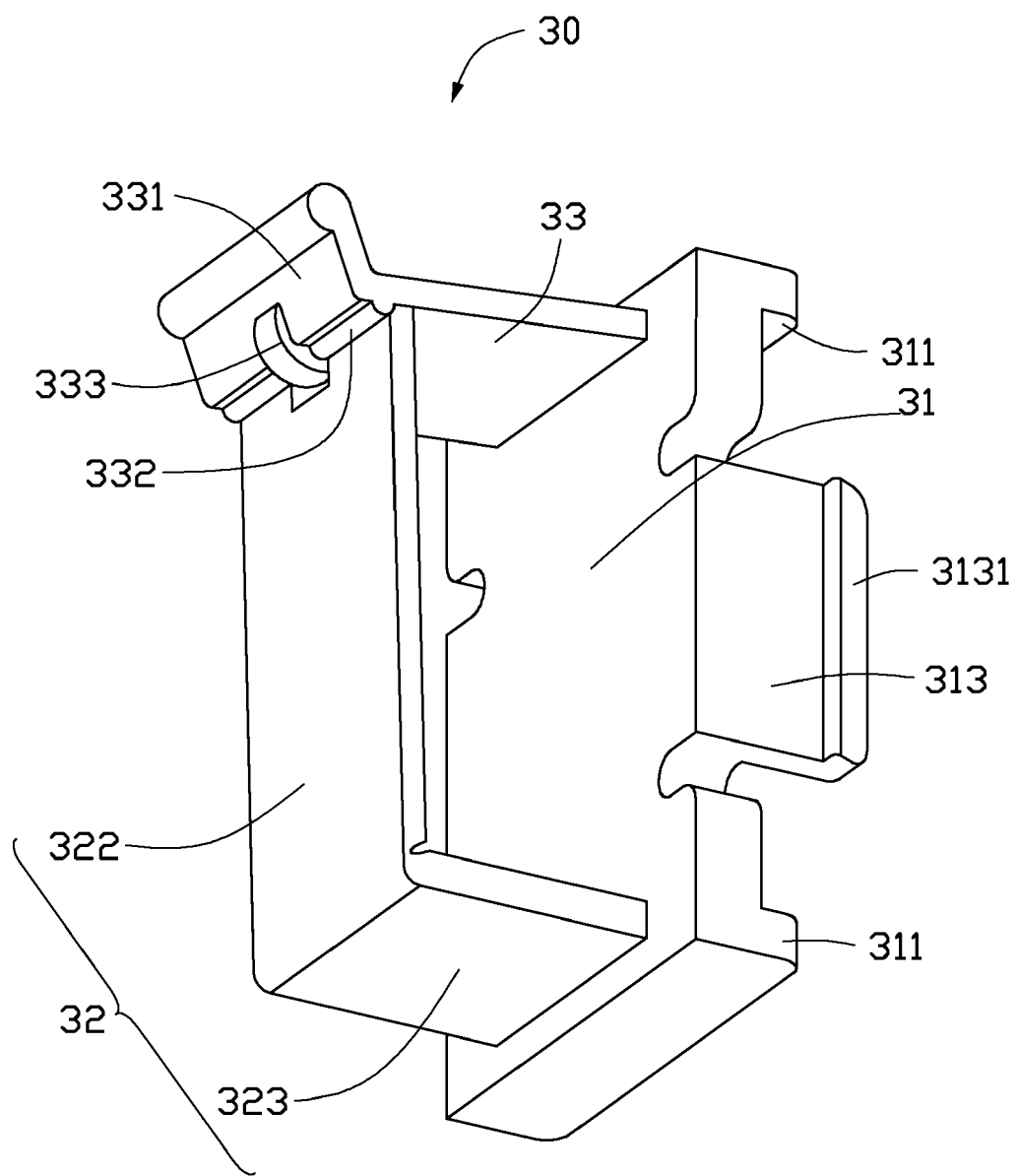
FIG. 3 is similar to FIG. 2, but viewed from another aspect.
Figure 4:
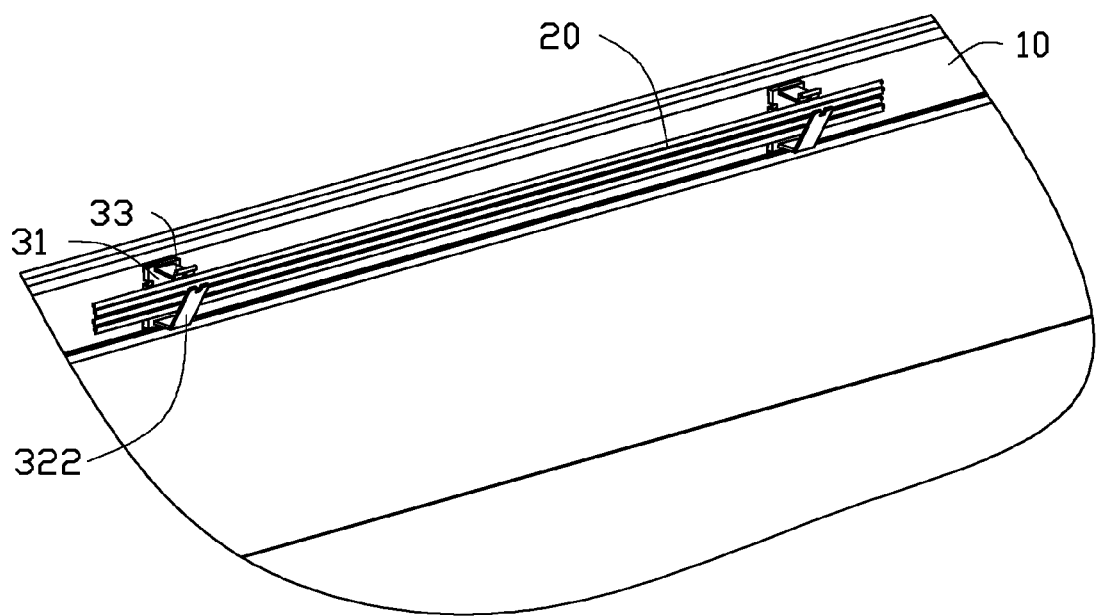
FIG. 4 is an assembled view of FIG. 1.

Referring to FIGS. 2 and 3, each cable management element 30 includes a base panel 31, a connecting portion 32 extending from the base panel 31, and a securing panel 33 extending from the base panel 31. The cable management element 30 further includes two positioning tabs 311 extending from the two ends of the base panel 31 which correspond to the first slots 111. The cable management element 30 further includes two resilient tabs 313 extending from opposite sides of the base panel 31 and which correspond to the second slots 113. Each resilient tab 313 is L-shaped. Each resilient tab 313 has a resilient portion 3130 and a bent portion 3131 substantially perpendicularly extending from the resilient portion 3130. In one embodiment, the two positioning tabs 311 are parallel and substantially perpendicular to the base panel 31. The connecting portion 32 includes a first connecting panel 323 extending from the base panel 31 and a second connecting panel 322 extending from the first connecting panel 323. The first connecting panel 323 is substantially perpendicular to the base panel 31. The connecting portion 32 defines a through slot 327 in the connection portion between the first connecting panel 323 and the second connecting panel 322. The second connecting panel 322 is permanently flexible relative to the first connecting panel 323 due to the through slot 327. The second connecting panel 322 includes a free end 3221. The free end 3221 defines a cutout 3223. The securing panel 33 includes a panel body 330 extending from the base panel 31, a handling portion 331 extending from the panel body 330, a securing portion 332 protruding from the panel body 330, and a resisting portion 333 extending from the connection portion between the securing panel 33 and the handling portion 331. The resisting portion 333 is connected to the securing portion 332. In one embodiment, the resisting portion 333 is disk-like, and the securing portion 332 is rod-like. The panel body 330 is substantially perpendicular to the base panel 31. A receiving space 329 is defined between the panel body 330 and the first connecting panel 323.

Referring to FIGS. 1 to 4, in assembly, the positioning tabs 311 of each cable management element 30 are inserted into the first slots 111 of the securing board 10. The resilient portions 3130 of each cable management element 30 are pressed towards each other. The resilient portions 3130 are deformed to enable the bent portions 3131 to be received in the second slots 113. The resilient tabs 313 engage and lock into the second slots 113 when the resilient portions 3130 are released. In this way, the cable management elements 30 are secured to the securing board 10. The cable 20 is placed in the receiving space 329 of each cable management element 30. The second connecting panel 322 of each cable management elements 30 is moved towards the panel body 330 until the securing portion 332 engages the free end 3221 of the second connecting panel 322. The free end 3221 is thus prevented from moving in a first direction parallel to the panel body 330. At the same time, the cutout 3223 rides over the resisting portion 333, thereby locating the free end 3221 precisely and preventing it from moving away from the panel body 330, in a second direction. Once in place, the second connecting panel 322 is substantially parallel to the base panel 31, and by these means, the cable 20 and other cables are secured in the cable management elements 30.

When the cable 20 needs to be removed from the cable management elements 30, the thumb tab or handling portion 331 of each cable management element 30 is pulled up to move away from the second connecting panel 322. The securing portion 332 is thus disengaged from the free end 3221 of the second connecting panel 322.

It is to be understood, however, that even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the invention to the full extent indicated by the broad general meaning of the terms in which the appended claims are expressed.

What is claimed is:

1. A cable management apparatus, comprising:
a securing board, the securing board defining a first slot and a second slot, an extending direction of the first slot being substantially perpendicular to an extending direction of the second slot; and
a cable management element comprising:
a base panel mounted on the securing board;
a connecting portion, the connecting portion comprising a first connecting panel extending from the base panel and a second connecting panel extending from the first connecting panel;
a positioning tab extending from the base panel for being received in the first slot;
a resilient tab extending from the base panel for being received in the second slot; and
a securing panel extending from the base panel, the securing panel comprising a panel body and a securing portion extending from the panel body; a receiving space defined between the panel body and the first connecting panel; the second connecting panel having a free end; and
the second connecting panel being capable of moving relative to the first connecting panel to enable the free end to engage the securing portion.

2. The cable management apparatus of claim 1, wherein the resilient tab is L-shaped, the resilient tab comprises a resilient portion extending from the base panel and a bent portion extending from the resilient portion, and the bent portion being substantially perpendicular to the resilient portion.

3. The cable management apparatus of claim 1, wherein a through slot is defined in a connection between the first connecting panel and the second connecting panel, thereby enable the second connecting panel to be capable of moving relative to the first connecting panel.

4. The cable management apparatus of claim 1, wherein the securing panel further comprises a handling portion extending from the panel body, and the handling portion configured to be pressed to move away from the second connecting panel to disengage the securing portion from the free end.

5. The cable management apparatus of claim 4, wherein the securing panel further comprises a resisting portion extending from a connection between the panel body and the handling portion, and the free end defines a cutout for receiving the resisting portion.

6. The cable management apparatus of claim 1, wherein the panel body is substantially perpendicular to the base panel.

7. The cable management apparatus of claim 1, wherein the first connecting panel is substantially perpendicular to the base panel.

8. A cable management apparatus, comprising:
a securing board, the securing board defining a first slot; and
a cable management element, the cable management element comprising:
a base panel mounted on the securing board;
a resilient tab secured in the first slot, the resilient tab is L-shaped, the resilient tab comprising a resilient portion extending from the base panel and a bent portion extending from the resilient portion, the bent portion being substantially perpendicular to the resilient portion;
a securing panel extending from the base panel; the securing panel comprising a panel body, a securing portion extending from the panel body, and a resisting portion extending from the panel body; and
a connecting portion, the connecting portion comprising a first connecting panel extending from the base panel and a second connecting panel extending from the first connecting panel; the second connecting panel having a free end, the free end defining a cutout; the free end engaging the securing portion to be prevented from moving along a first direction substantially parallel to the panel body; and the cutout receiving the resisting portion to prevent the free end from moving along a second direction substantially perpendicular to the first direction, the second direction substantially parallel to the panel body.

9. The cable management apparatus of claim 8, wherein the securing board defines a second slot, and the cable management element further comprises a positioning tab received in the second slot, an extending direction of the first slot being substantially perpendicular to an extending direction of the second slot.

10. The cable management apparatus of claim 8, wherein the securing panel further comprises a handling portion extending from the panel body, the handling portion configured to be pressed to move away from the second connecting panel to disengage the securing portion from the free end and disengage the resisting portion from the cutout.

11. The cable management apparatus of claim 8, wherein a through slot is defined in a connection between the first connecting panel and the second connecting panel, thereby enabling the second connecting panel to be capable of moving relative to the first connecting panel.

12. The cable management apparatus of claim 8, wherein the panel body is substantially perpendicular to the base panel.

13. The cable management apparatus of claim 8, wherein the first connecting panel is substantially perpendicular to the base panel.

14. The cable management apparatus of claim 8, wherein the second connecting panel is substantially parallel to the base panel.

* * * * *